United States Patent
Linkowski et al.

(10) Patent No.: US 11,403,437 B2
(45) Date of Patent: Aug. 2, 2022

(54) METHOD AND SYSTEM FOR DETERMINING SENSOR PLACEMENT FOR A WORKSPACE

(71) Applicant: Ford Global Technologies, LLC, Dearborn, MI (US)

(72) Inventors: Gregory P. Linkowski, Dearborn, MI (US); Ling Zhu, Canton, MI (US); Mario Anthony Santillo, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 128 days.

(21) Appl. No.: 16/829,429

(22) Filed: Mar. 25, 2020

(65) Prior Publication Data
US 2021/0303745 A1  Sep. 30, 2021

(51) Int. Cl.
| | |
|---|---|
| *G06F 17/10* | (2006.01) |
| *G06F 30/13* | (2020.01) |
| *G06F 30/20* | (2020.01) |
| *G06T 17/05* | (2011.01) |

(52) U.S. Cl.
CPC .............. *G06F 30/13* (2020.01); *G06F 30/20* (2020.01); *G06T 17/05* (2013.01)

(58) Field of Classification Search
CPC ................ G06F 30/20; G06T 17/05
USPC ............................................. 703/1
See application file for complete search history.

(56) References Cited

U.S. PATENT DOCUMENTS

| | | | |
|---|---|---|---|
| 7,259,778 B2 | 8/2007 | Arpa et al. | |
| 8,442,306 B2 | 5/2013 | Garaas et al. | |
| 8,830,230 B2 | 9/2014 | Bai et al. | |
| 2011/0270443 A1* | 11/2011 | Kamiya | G05B 19/401 700/245 |
| 2018/0117766 A1* | 5/2018 | Atohira | B25J 9/1697 |
| 2018/0250820 A1* | 9/2018 | Shimodaira | G06F 30/23 |
| 2019/0126475 A1* | 5/2019 | Kawanishi | B25J 9/1666 |
| 2019/0303759 A1 | 10/2019 | Farabet et al. | |

\* cited by examiner

*Primary Examiner* — Andre Pierre Louis
(74) *Attorney, Agent, or Firm* — Burris Law, PLLC (57) ABSTRACT

A method includes generating a workspace model having a robot based on at least one of an environment parameter and a regulated space. The workspace model is a digital model of a workspace. The method includes simulating a sensor operation of a sensor within the workspace model based on sensor characteristics of the sensor. The method includes identifying an undetectable area within the workspace model having the robot based on the simulated sensor operation. The method includes determining whether the undetectable area satisfies one or more detection metrics. The method includes performing a sensor placement control in response to the undetectable area not satisfying the one or more detection metrics to obtain a sensor placement scheme of the workspace. The sensor placement scheme identifies an undetectable area within the workspace when applicable.

14 Claims, 9 Drawing Sheets

METHOD AND SYSTEM FOR DETERMINING SENSOR PLACEMENT FOR A WORKSPACE

FIELD

The present disclosure relates to method and/or system for positioning one or more sensors within a workspace.

BACKGROUND

The statements in this section merely provide background information related to the present disclosure and may not constitute prior art.

A workspace can include one or more industrial robots that perform various automated tasks. Furthermore, the workspace may include one or more sensors configured to obtain image data of the workspace, thereby enabling a computing device and/or a robot controller to identify objects in the workspace. By identifying objects in the workspace, the industrial robot can accommodate the objects within the workspace while performing various automated tasks. However, undetectable zones within the workspace due to, for example, the limitations of the one or more sensors, placement of robots, and/or workspace configuration, among other factors, may prevent the industrial robot from accommodating the objects within the undetectable zones of the workspace.

These issues with the use of industrial robots in a manufacturing environment, among other issues with industrial robots, are addressed by the present disclosure.

SUMMARY

This section provides a general summary of the disclosure and is not a comprehensive disclosure of its full scope or all of its features.

The present disclosure provides a method including generating a workspace model having a robot based on at least one of an environment parameter and a regulated space, where the workspace model is a digital model of a workspace. The method includes simulating a sensor operation of a sensor within the workspace model based on sensor characteristics of the sensor. The sensor characteristics may include a field of view of the sensor, a pose of the sensor, a location of the sensor, or a combination thereof. The method includes identifying an undetectable area within the workspace model having the robot based on the simulated sensor operation, determining whether the undetectable area satisfies one or more detection metrics, and performing a sensor placement control in response to the undetectable area not satisfying the one or more detection metrics to obtain a sensor placement scheme of the workspace. The sensor placement control identifies an undetectable area within the workspace when applicable.

In some forms, performing the sensor placement control further comprises modifying a sensor configuration within the workspace model based on a sensor placement algorithm. The sensor configuration includes changing a number of sensors in the workspace model, placement of the sensor, pose of the sensor, or a combination thereof.

In some forms, the sensor placement algorithm is configured to iteratively modify the sensor configuration based on one or more predefined sensor layouts until the undetectable area within the workspace model satisfies the one or more detection metrics.

In some forms, the method further comprises simulating a robot operation within the workspace model. The robot simulation is based on a first robot pose of the robot and positional characteristics of the robot, and the undetectable area within the workspace model is further identified based on the robot operation.

In some forms, the positional characteristics of the robot provide a static operation of the robot, a dynamic operation of the robot, or a combination thereof.

In some forms, the positional characteristics includes the dynamic operation of the robot, and the robot operation includes a plurality of robot poses performable by the robot.

In some forms, the environment parameter includes an operating range of the robot.

In some forms, the regulated space includes at least one of a restricted zone and a hazard zone.

The present disclosure provides a system including one or more processors configured to execute instructions stored in a nontransitory computer-readable memory. The instructions include generating a workspace model having a robot based on at least one of an environment parameter and a regulated space, where the workspace model is a digital model of a workspace. The instructions include simulating a sensor operation of a sensor within the workspace model based on sensor characteristics of the sensor, where the sensor characteristics includes a field of view of the sensor, a pose of the sensor, a location of the sensor, or a combination thereof. The instructions include identifying an undetectable area within the workspace model having the robot based on the simulated sensor operation, determining whether the undetectable area satisfies one or more detection metrics, and performing a sensor placement control in response to the undetectable area not satisfying the one or more detection metrics to obtain a sensor placement scheme of the workspace. The sensor placement control identifies an undetectable area within the workspace when applicable.

In some forms, the instructions for performing the sensor placement control further comprises modifying a sensor configuration within the workspace model based on a sensor placement algorithm. The sensor configuration includes changing a number of sensors in the workspace model, placement of the sensor, pose of the sensor, or a combination thereof.

In some forms, the sensor placement algorithm is configured to iteratively modify the sensor configuration based on one or more predefined sensor layouts until the undetectable area within the workspace model satisfies the one or more detection metrics.

In some forms, the instructions further comprise simulating a robot operation within the workspace model. The robot simulation is based on a first robot pose of the robot and positional characteristics of the robot, and the undetectable area within the workspace model is further identified based on the robot operation.

In some forms, the positional characteristics of the robot provide a static operation of the robot, a dynamic operation of the robot, or a combination thereof.

In some forms, the positional characteristics include the dynamic operation of the robot, and the robot operation includes a plurality of robot poses performable by the robot.

In some forms, the environment parameter includes an operating range of the robot.

In some forms, the regulated space includes at least one of a restricted zone and a hazard zone.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure provides for a sensor placement computing system that optimizes sensor coverage of a workspace. The sensor placement computing system may generate a digital model of a workspace or platform, simulate sensor characteristics of one or more sensors and robot characteristics of one or more robots of the workspace, and identify undetectable zones within the workspace. Subsequently, the sensor placement computing system may compare the undetectable zones to one or more metrics and optimize the sensor layout of the workspace based on the comparison, which may include adjusting a number of sensors, a placement of the sensors, a pose of the sensors, or a combination thereof. Accordingly, optimizing the sensor layout enables the workspace to minimize undetectable areas, reduce a number of sensors, or a combination thereof.

Figure 1:
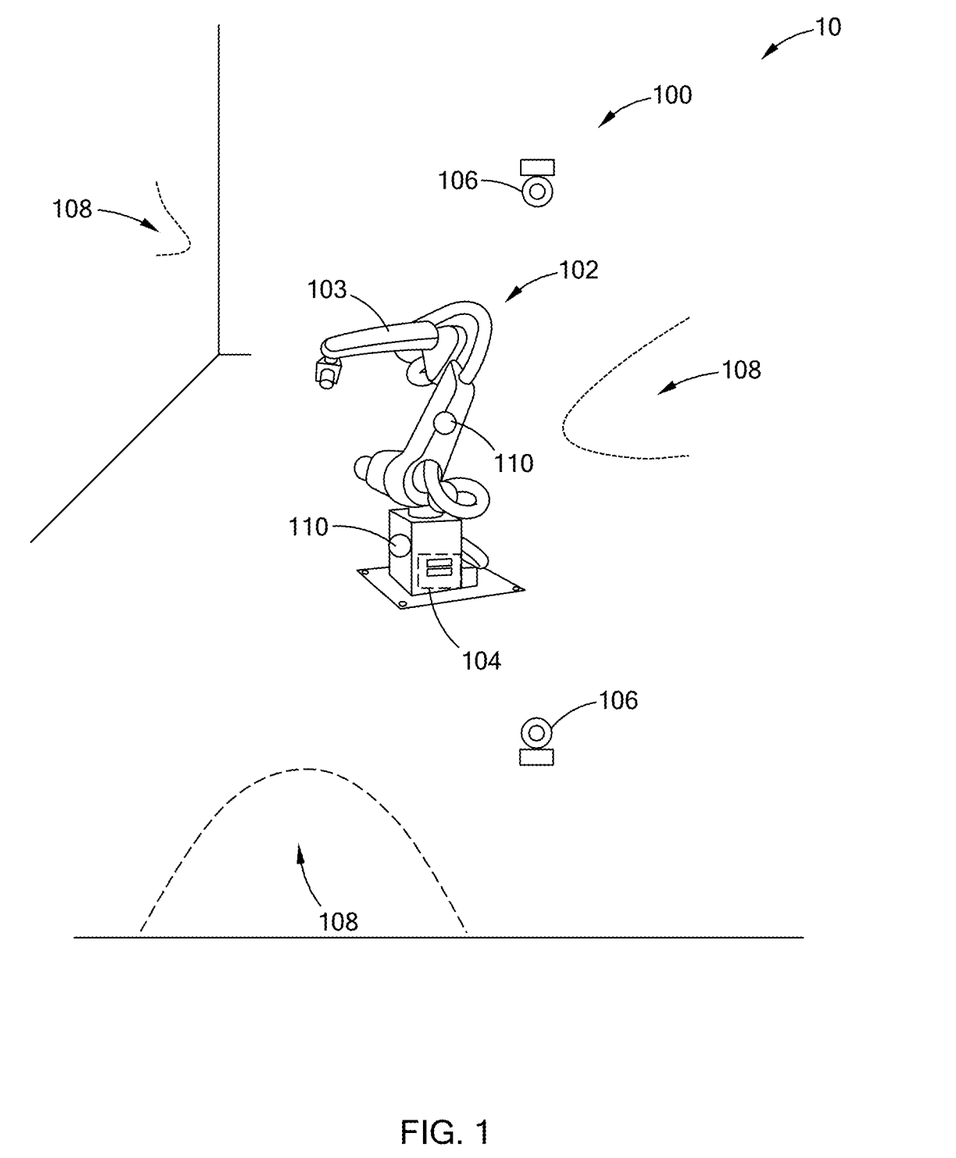
FIG. 1 illustrates a workspace in accordance with the teachings of the present disclosure.

Referring to FIG. 1, a system 10 includes a workspace, generally referenced by reference number 100, in a manufacturing facility and a robot 102 within the workspace 100. The workspace 100 may be an uncaged area having no fence or other containment-like structure for confining the movement of the robot 102 or a caged area having a fence or other containment-like structure for confining the movement of the robot 102. The workspace 100 may also be a mobile platform configured to move to various parts of the manufacturing facility.

In one form, the robot 102 includes a robotic arm 103 with varying range of motion and a robot controller 104 configured to operate the robotic arm 103 to perform one or more automated tasks. As an example, the robot controller 104 may control the robotic arm 103 to pick-up and move a workpiece (not shown) from a staging area to a processing area. While the robot 102 is illustrated as a stationary robotic arm, the robot may be any other suitable robot and should not be limited to the robot illustrated in the figure. For example, the robot 102 may be a mobile robot. While FIG. 1 illustrates one robot 102, it should be understood that any number of robots 102 may be provided within the workspace 100 in other forms, and that the robots may be different from one another.

To monitor the robot 102, the workspace 100 includes workspace sensor(s) 106 positioned at various locations within the workspace 100. In some forms, the workspace sensor(s) 106 may be image sensors configured to obtain image data of the workspace 100. As an example, the workspace sensor(s) 106 include, but are not limited to: a two-dimensional camera, a three-dimensional camera, an infrared sensor, a radar scanner, a laser scanner, a light detection and ranging (LIDAR) sensor, an ultrasonic sensor, and/or the like. As described below in further detail, a computing system in communication with the robot 102 and the workspace sensor(s) 106 uses the data from the workspace sensor(s) 106 to form a digital model of the workspace 100, identify undetectable areas, such as dashed areas 108 within the workspace 100, and/or optimize a sensor configuration of the workspace 100.

In one form, the robot 102 includes one or more robot sensors 110 (i.e., "robot sensors" 110 herein) to generate data corresponding to various operating metrics of the robot 102. As an example, the robot sensors 110 may include a location sensor (e.g., a near-field communication (NFC) sensor, an ultrawide-band (UWB) sensor) configured to generate location information of the robot 102. As another example, the robot sensors 110 may include an accelerometer, a gyroscope, and/or a magnetometer configured to generate orientation information of the robot 102. As yet another example, the robot sensors 110 may include a velocity sensor configured to generate velocity information of the robot 102, a power sensor to measure current and/or voltage being applied by a power source, a torque sensor configured to generate torque information of various joints of the robot 102, and/or a touch sensor at a handle of the robot 102 configured to detect contact. The robot sensors 110 are configured to provide the data to the robot controller 104 for further processing and for controlling the robotic arm 103. While specific examples are provided herein, the robot 102 may include other sensors and should not be limited to the sensors described herein.

The robot controller 112 includes computer-readable software programs that are executed by one or more processors of the robot controller 112. As an example, the robot controller 112 includes computer-software programs that, when executed, cause the robot controller 112 to execute predefined automated tasks stored in a task library/database (not shown). The predefined automated task may refer to one or more motions the robot 102 performs to achieve a desired result. In some forms, the predefined automated tasks are associated with one or more commands to be provided to the robot controller 112 for having the robot 102 execute the automated task. The commands may include operation parameters for the robot 102, such as operation state (e.g., wait, stop, off, moving, etc.), speed, trajectory, acceleration, torque, rotation directions, among others. As another example, the robot controller 112 includes computer-software programs that, when executed, causes the robot controller 112 to obtain the sensor data from the robot sensors 110 of the robot 102 and communicate the sensor data to a computing device communicatively coupled to the robot controller 112, as described below in further detail.

Figure 2A:
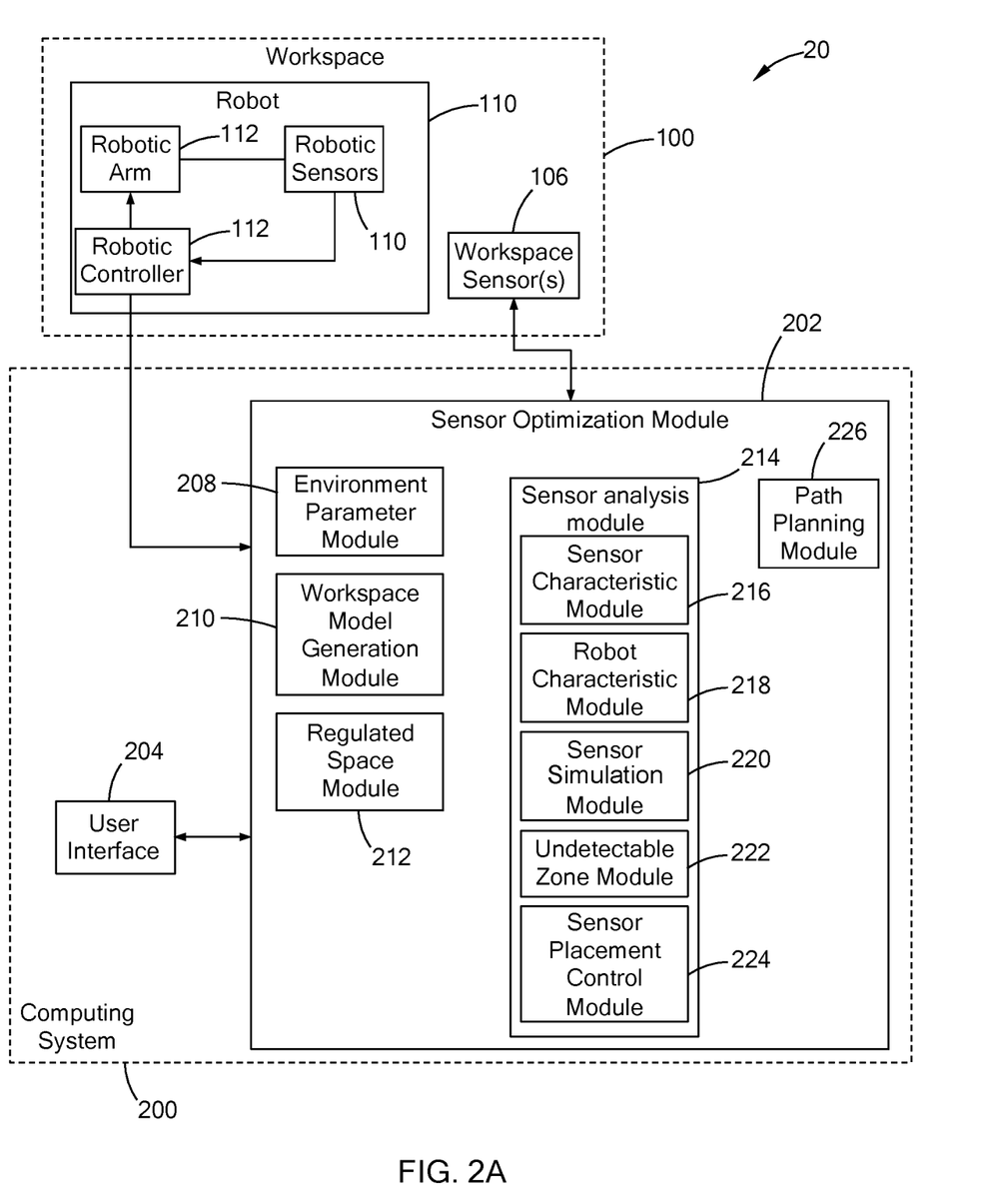
FIG. 2A is a functional block diagram of an example sensor coverage detection system in accordance with the teachings of the present disclosure.

Referring to FIG. 2A, a block diagram 20 illustrating a sensor placement computing system 200 communicatively coupled to the robot controller 112 and the workspace sensor(s) 106 is shown. In one form, the sensor placement computing system 200 is communicatively coupled to the robot controller 112 and the workspace sensor(s) 106 by way of an area network, a dedicated communication link, or a combination thereof. Accordingly, the sensor placement computing system 200, the workspace sensor(s) 106, and the robot controller 112 each include hardware components to establish the communication link in accordance with a communication protocol, such as a wired communication protocol, Bluetooth protocol, Zigbee protocol, Wi-Fi protocol, UWB protocol, NFC protocol, and cellular protocols, among others. In some forms, the hardware components of the sensor placement computing system 200 and the robot controller 112 include, but are not limited to, transceivers, routers, input/output ports, and software executable by one or more processors.

As described above, the robot controller 112 obtains data from the robot sensors 110 and in one form, processes the data to monitor operations of the robotic arm 103. As another example, the robot controller 112 is configured to fuse location information and orientation information provided by one or more of the robot sensors 110 to generate pose information (i.e., position and orientation information) of the robotic arm 103. In one form, the robot controller 112 is configured to generate and transmit a data packet representing the pose information in accordance with a transmission protocol of the robot controller 112 and the sensor placement computing system 200.

In one form, the sensor placement computing system 200 includes a sensor optimization module 202 and a user interface 204. The sensor optimization module 202 includes computer-readable software programs that are executable by the one or more processors of the sensor placement computing system 200. Accordingly, the sensor placement computing system 200 may include a microprocessor(s), a memory for storing code executed by the microprocessor(s), and other suitable hardware components to provide the described functionality of the sensor placement computing system 200. In some forms, the sensor optimization module 202 includes an environment parameter module 208, a workspace model generation module 210, a regulated space module 212, a sensor analysis module 214, and a path planning module 226.

The environment parameter module 208 is configured to identify various operating parameters of the workspace 100. In one form, the operating parameters of the workspace 100 include, but are not limited to: a 2D/3D operating range of the robot 102, a size of the robot 102, a type of robot 102 (e.g., a cartesian robot, a cylindrical robot, a spherical robot, a parallel robot, an articulated robot, among others), a degree of freedom of the robot 102, and/or the dimensions of a mobile platform in which the workspace 100 is provided, among others. The operating parameters of the workspace 100 may be obtained from the robot controller 112 and/or inputted by an user using the user interface 204, which may include at least one of a touchscreen display for generating the input, a microphone for generating the input, buttons for generating the input, barcode scanners for generating the input, among others.

Figure 2B:
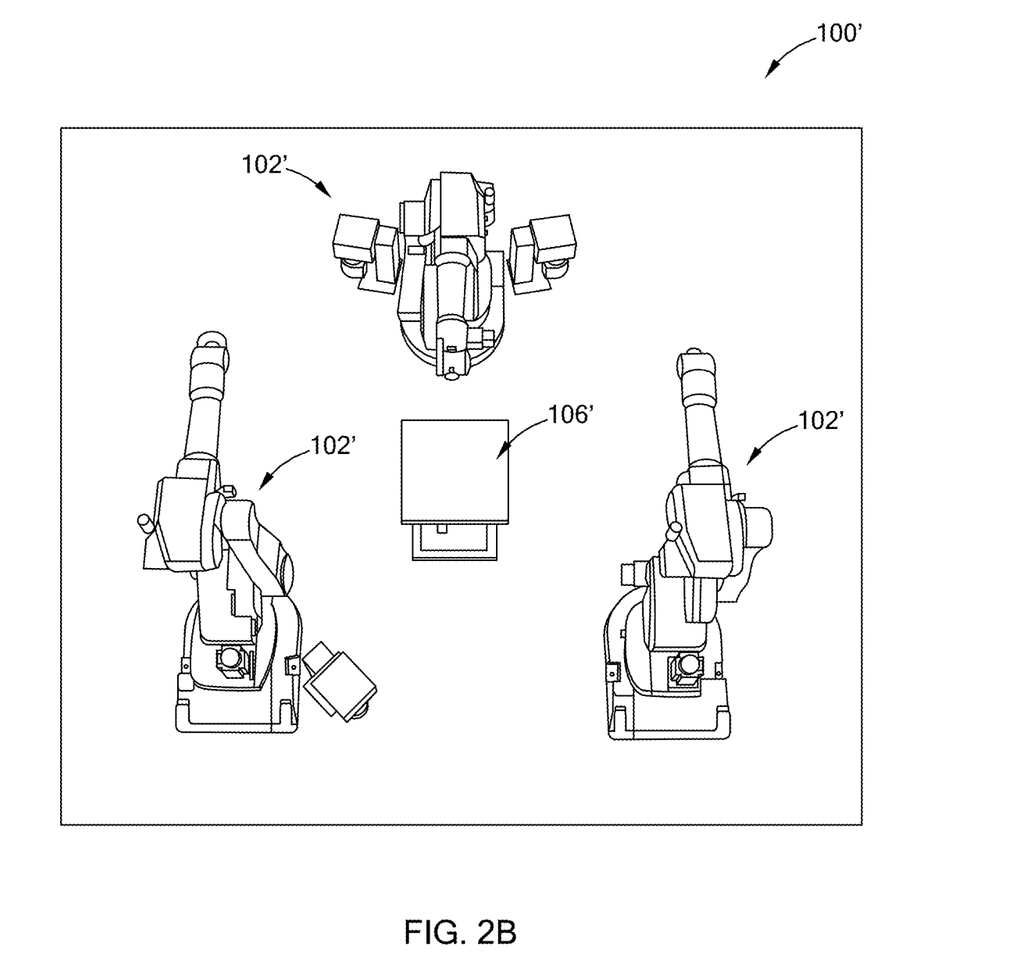
FIG. 2B is digital model of a workspace in accordance with the teachings of the present disclosure.

The workspace model generation module 210 is configured to generate a digital model of the workspace 100 based on a virtual representation of the workspace 100. As an example and as shown in FIG. 2B, the workspace model generation module 210 is configured to generate a digital model of the workspace 100 having three of the robots 102. The digital model is provided herein as digital model 100'. In some forms, the virtual representation may define boundaries of the workspace 100 and include digital representations of various fixed objects of the workspace 100, such as a digital representation of the robot 102 (hereinafter referred to as robot 102'), a digital representation of the robot sensors 110 (hereinafter referred to as robot sensors 110'), and/or a digital representation of the workspace sensor(s) 106 (hereinafter referred to as workspace sensor(s) 106'). In some forms, the virtual representation may be predetermined and stored in the sensor placement computing system 200 (e.g., stored in a database of the sensor placement computing system 200). Furthermore, if new features are added to the workspace 100, the virtual representation may also be updated and stored in the sensor placement computing system 200. In one form, the virtual representation is a computer aided design (CAD) drawing/modeling of the workspace 100 and the robots 102 within the workspace 100. As another example, the virtual representation is a model where modeled components can be moved (e.g., a modeled component indicative of the robot 102 being configured according to joint angles measured by the built-in encoders).

In some forms, the workspace model generation module 210 is configured to generate the digital model 100' based on the operating parameters, the virtual representation, and/or the sensor data from the workspace sensor(s) 106 and/or the robot sensors 110. That is, when the workspace sensor(s) 106 include one or more 2D/3D cameras, the workspace model generation module 210 performs a spatial transformation of the data from the one or more 2D/3D cameras. Using the virtual representation, the workspace model generation module 210 performs a mapping function that defines a spatial correspondence between all points in an image from the one or more 2D/3D cameras with the virtual representation. Example spatial transformation techniques for digital image processing include, but are not limited to, a checkerboard, QR-Code style artifact, among others, and the spatial transformation techniques can be used to calibrate extrinsic characteristics, (e.g., the pose of the workspace sensor(s) 106). With the extrinsic characteristics, various known algorithms can be used to position the recorded data in the real world (i.e., to convert from the camera frame to the world frame).

In some forms, the workspace model generation module 210 is configured to identify and classify objects provided in the digital model 100'. As an example, the workspace model generation module 210 identifies and classifies the objects of the digital model 100' based on an object classification library, which associates a plurality of objects with one or more classifications. The classifications may include, but are not limited to: the robot 102, the workspace sensor(s) 106, the robot sensors 110, a human, a moveable object (e.g., a workpiece, a power tool, fasteners, among others), a static object (e.g., workbench, table, human machine interface, among others), and/or the like.

In some forms, the workspace model generation module 210 is configured to designate the digital model 100' as one of a static model or dynamic model. As described below in further detail, the sensor analysis module 214 is configured to generate a static simulation and/or a dynamic simulation of the digital model 100' based on the designation. In some forms, the designation as one of the static model and/or the dynamic model may be made using the user interface 204.

The regulated space module 212 is configured to identify a regulated space within the digital model 100'. The regulated space may include a hazard zone and/or a restricted zone. As used herein, the phrase "hazard zone" refers to a location in which a risk level of a collision between the robot 102' (or the robot 102) and another object exceeds a threshold risk level. As used herein, the phrase "restricted zone" refers to a location that the robot 102' (or the robot 102) utilizes when performing one or more automated tasks. In some forms, the hazard zone and restricted zone may be identified within the digital model 100' by defining, using the user interface 204, the hazard zone and restricted zone within the digital model 100'. As an example, the user may select, using the user interface 204, a location within the digital model 100', and in response to the selection, the regulated space module 212 is configured to calculate the corresponding hazard zone based on, for example, safety-specified values for human approach speeds, sensor latency of the robot sensors 110, and/or the workplace sensor(s) 106, among others. In one form, the restricted zone may be identified based on information indicating one or more automated tasks of the robot 102 and received from the robot controller 112.

In some forms, the sensor analysis module 214 includes a sensor characteristic module 216, a robot characteristic module 218, a sensor simulation module 220, an undetectable zone module 222, and a sensor placement control module 224. The sensor characteristic module 216 is configured to define the sensor characteristics of the workspace sensor(s) 106'. The sensor characteristics can include, but are not limited to: a sensor type, a field of view, and a location, among others. In one form, the sensor characteristics may be inputted by a user of the sensor placement computing system 200 via the user interface 204. In another form, the sensor characteristics may be predetermined and selected from a repository (e.g., a database). In yet another form, the sensor characteristics may be obtained from the workspace sensor(s) 106 of the workspace 100.

The robot characteristic module 218 is configured to define the robot characteristics of the robot 102' (or the robot 102). The robot characteristics can include, but are not limited to: spatial-related parameters (e.g., a pose, a location), the operating parameters, among others. The robot characteristics may be inputted by a user of the sensor placement computing system 200 via the user interface 204. In another form, the robot characteristics may be predetermined and selected from a repository (e.g., a database). In yet another form, the robot characteristics may be obtained from the robot sensors 110 of the robot 102 in the workspace 100.

When the sensor characteristics and/or the robot characteristics are defined, the sensor simulation module 220 is configured to generate a dynamic simulation and/or a static simulation of the operation of the workspace sensor(s) 106' and/or the robot 102'. As an example, if the workspace model generation module 210 designates the digital model 100' as a static model, the sensor simulation module 220 is configured to generate a static simulation of the operation of the workspace sensor(s) 106' and/or the robot 102'. As another example, if the workspace model generation module 210 designates the digital model 100' as a dynamic model, the sensor simulation module 220 is configured to generate a dynamic simulation of the operation of the workspace sensor(s) 106' and/or the robot 102'. As used herein, the phrase "static simulation" refers to a simulation of the workspace sensor(s) 106' and/or the robot 102' while the robot 102' refrains from adjusting the spatial-related parameters (e.g., a pose, a location) of the robot 102' during the simulation. As used herein, the phrase "dynamic simulation" refers to a simulation of the workspace sensor(s) 106' and/or the robot 102' while the robot 102' adjusts at least one spatial-related parameter (e.g., a pose, a location) of the robot 102' during the simulation.

During (or after) the simulation of the operation of the workspace sensor(s) 106' and/or the robot 102', the undetectable zone module 222 is configured to identify an undetectable zone within the digital model 100'. As referred to herein, the phrase "undetectable zone" refers to a zone in which the workspace sensor(s) 106' are unable to obtain sensor data based on, for example, the sensor characteristics and/or presence of objects in the digital model 100' including the robot. In addition to identifying an undetectable zone within the digital model 100', the undetectable zone module 22 may identify other zones of the digital model 100', such as a detectable zone and/or an occupied zone. As referred to herein, the phrase "detectable zone" refers to a zone in which the workspace sensor(s) 106' (or workspace sensor(s) 106) are able to obtain image data of the digital model 100' (or the workspace 100). As referred to herein, the phrase "occupied zone" refers to a zone in which an object, such as a robot 102' (or robot 102), is located.

The sensor placement control module 224 is configured to modify a sensor configuration within the digital model 100' based on a sensor placement routine. The sensor placement routine includes iteratively modifying a sensor configuration of the workspace sensor(s) 106' based on one or more predefined sensor layouts until the undetectable area within the digital model 100' satisfies one or more detection metrics, as described below in further detail. In one form, modifying the sensor configuration includes changing a number of the workspace sensor(s) 106' of the digital model 100', a placement of the workspace sensor(s) 106' of the digital model 100', a pose of the workspace sensors 106' of the digital model 100', or a combination thereof. In one form, the sensor placement control module 224 may be based on a genetic algorithm or incorporate a level of artificial intelligence (AI) to iteratively find an optimal layout.

In one form, the sensor placement control module 224 may be configured to modify the sensor configuration in accordance with a predefined hierarchy. As an example, a first step of the predefined hierarchy is associated with verifying that the size of the undetectable zones are minimized. A second step of the predefined hierarchy may be associated with verifying that the number of workspace sensor(s) 106 is minimized. A third step of the predefined hierarchy may be associated with verifying that predefined areas within the workspace 100 are not within the undetectable zone. The example predefined hierarchy described above may be represented using the relations (1)-(3) of the following relations:

$$\text{maximize} \sum_{i,j,k=1}^{I,J,K} C(i,j,k) \qquad (1)$$

$$\text{minimize } n \qquad (2)$$

-continued $$\text{subject to } C(i, j, k) \geq m \, \forall \, i, j, k, (i, j, k) \in V_{predefined} \quad (3)$$

$$\text{subject to } C(i, j, k) \leftarrow f_{coverage}(C_{space}, L, N) \quad (4)$$

$$\text{subject to } N_{min} \leq N \leq N_{max} \quad (5)$$

$$\text{subject to } (X_{min}, Y_{min}, Z_{min}) \leq L \leq (X_{max}, Y_{max}, Z_{max}) \quad (6)$$

$$\text{where } C_{space}(i, j, k) = \begin{cases} 0, & \text{workspace}[i, j, k] \text{ is detectable zone} \\ 1, & \text{workspace}[i, j, k] \text{ is undetectable zone} \end{cases} \quad (7)$$

$$\text{where } C(i, j, k) \begin{cases} \geq m, & \text{workspace}[i, j, k] \text{ is detectable zone} \\ < m, & \text{workspace}[i, j, k] \text{ is undetectable zone} \end{cases} \quad (8)$$

Using relations (4)-(8), the sensor placement control module 224 may determine the sensor configuration of the workspace 100. In the above relations, i, j, and k represent axes in discretized space, and x, y, and z represent axes in the original and continuous space. In the above relations, C(i, j, k) represents the detectable zones of the workspace 100, n represents a number of sensors, and m represents a minimum number of sensors. In the above relations, $V_{predefined}$ represents the predefined areas within the workspace 100 that are not within the undetectable zone, $C_{space}$ represents the spatial transformations derived from the workspace sensor(s) 106 to generate the digital model 100', L represents a lower bound of a design variable, and N represents an upper bound of the design variable. In one form, the optimization relations may be solved using a multi-objective optimization method such as ParEGO, NSGAII, MOEA-D, among others. It should be understood that the sensor placement control module 224 may execute other relations and/or in accordance with other predefined hierarchies and is not limited to the example described herein.

While the above examples illustrate the simulation of the workspace sensor(s) 106' and/or the robot 102', the sensor placement computing system 200 may be configured to perform the functionality described herein while the robot 102 is executing various tasks. As an example, the path planning module 226 is configured to identify intrusions into an undetectable zone of the workspace 100 by, for example, the robot 102, a moveable object, a static object, among others, and execute a path planning routine based on the identified intrusions, as described below in further detail with reference to FIG. 5.

Figure 3A:
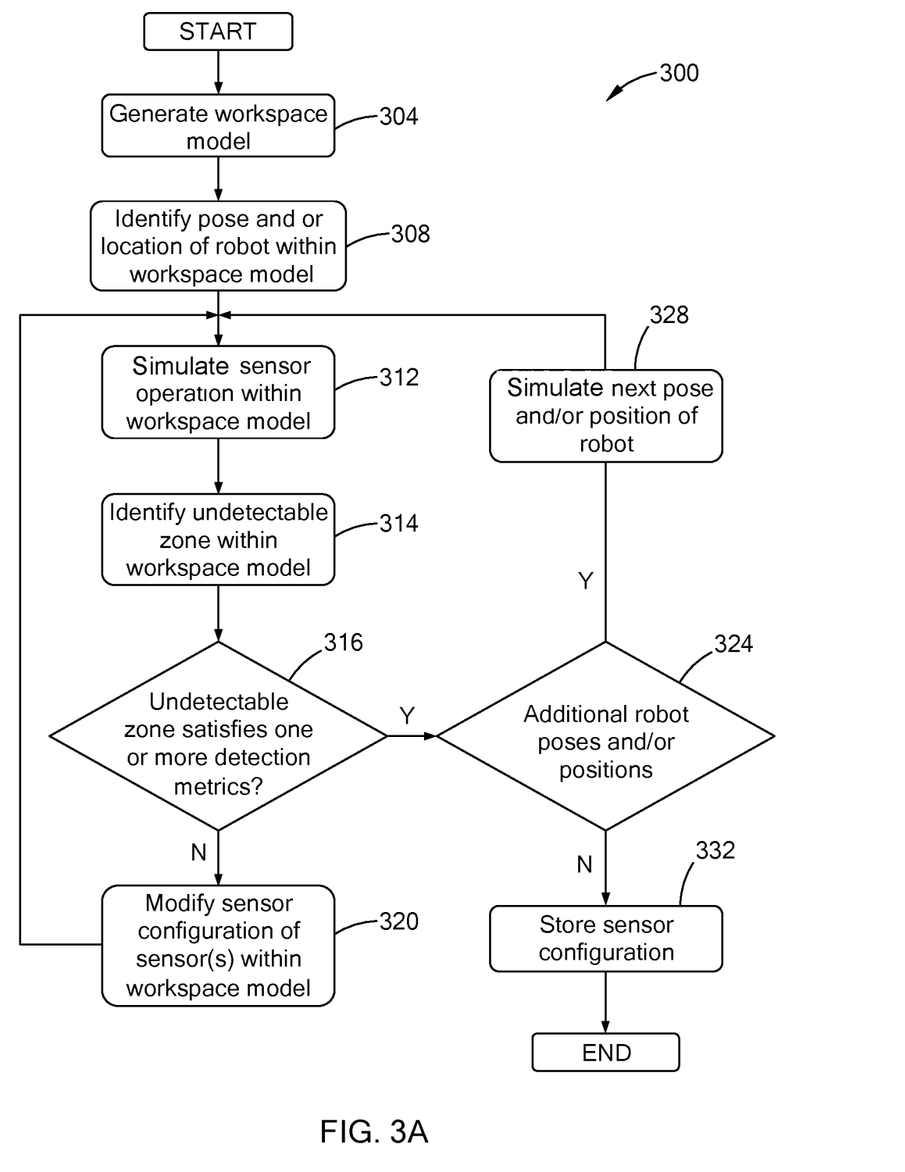
FIG. 3A illustrates an example control routine in accordance with the teachings of the present disclosure.
Figure 3B:
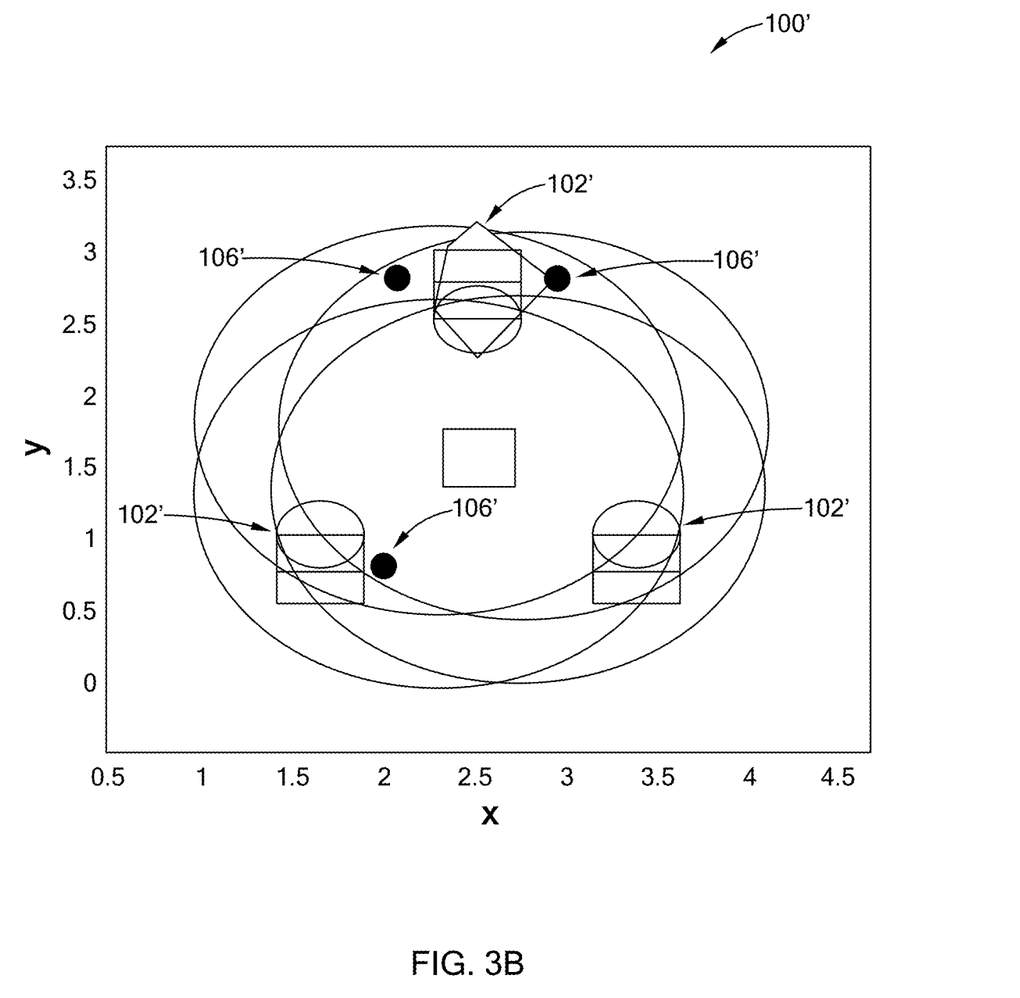
FIG. 3B illustrates an example workspace model in accordance with the teachings of the present disclosure.

Referring to FIG. 3A, an example sensor simulation routine 300 is provided, and the simulation routine 300 is performed by the sensor placement computing system 200. At 304, the sensor placement computing system 200 generates the digital model 100'. As an example, the sensor placement computing system 200 may generate the digital model 100' based on data regarding at least one of the workspace 100, the workspace sensors 106, or the robots 102. An example of the digital model 100' is illustrated in FIG. 3B. At 308, the sensor placement computing system 200 identifies the pose and/or location of the robot 102' within the digital model 100'.

Figure 3C:
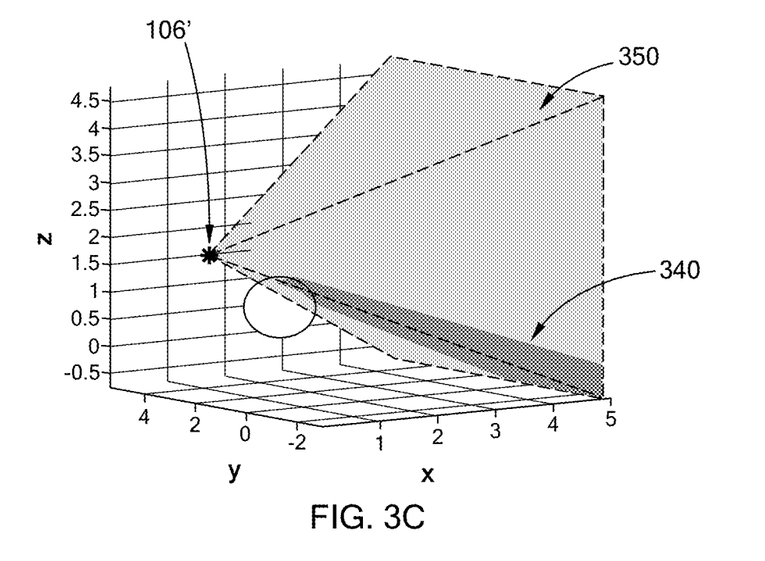
FIG. 3C illustrates an example undetectable area in accordance with the teachings of the present disclosure.
Figure 3D:
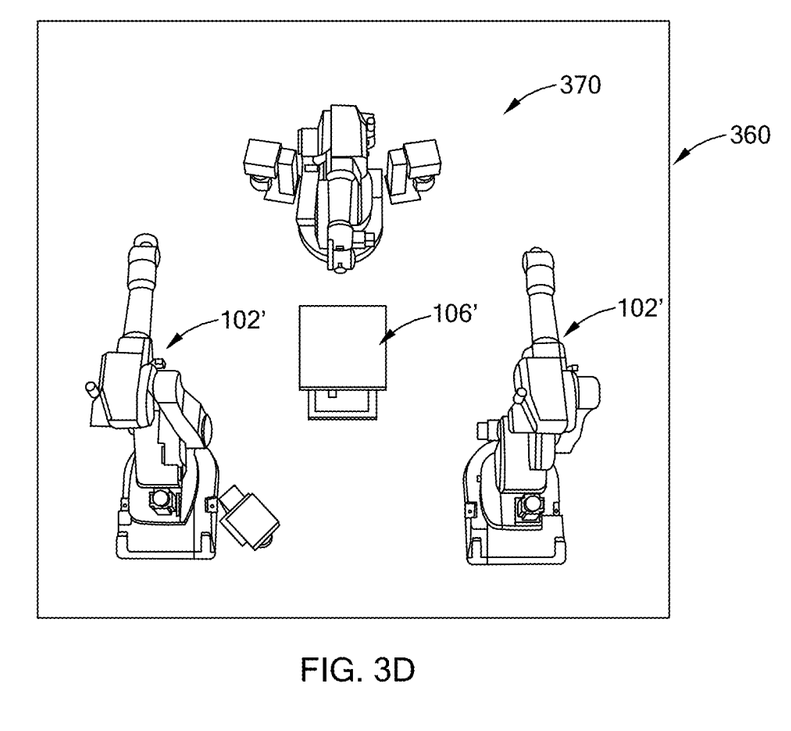
FIG. 3D illustrates another example undetectable area in accordance with the teachings of the present disclosure.

At 312, the sensor placement computing system 200 simulates the sensor operation of the workspace sensor(s) 106' within the digital model 100'. At 314, the sensor placement computing system 200 identifies the undetectable zones within the digital model 100'. As an example and as illustrated in FIG. 3C, the sensor placement computing system 200 identifies zone 340 as the undetectable zone and zone 350 as the detectable zone based on the simulated sensor operation of the workspace sensor(s) 106' within the digital model 100'. As another example and as illustrated in FIG. 3D, the sensor placement computing system 200 identifies zone 360 as the undetectable zone and zone 370 as the detectable zone based on the simulated sensor operation of the workspace sensor(s) 106' within the digital model 100'.

Figure 3E:
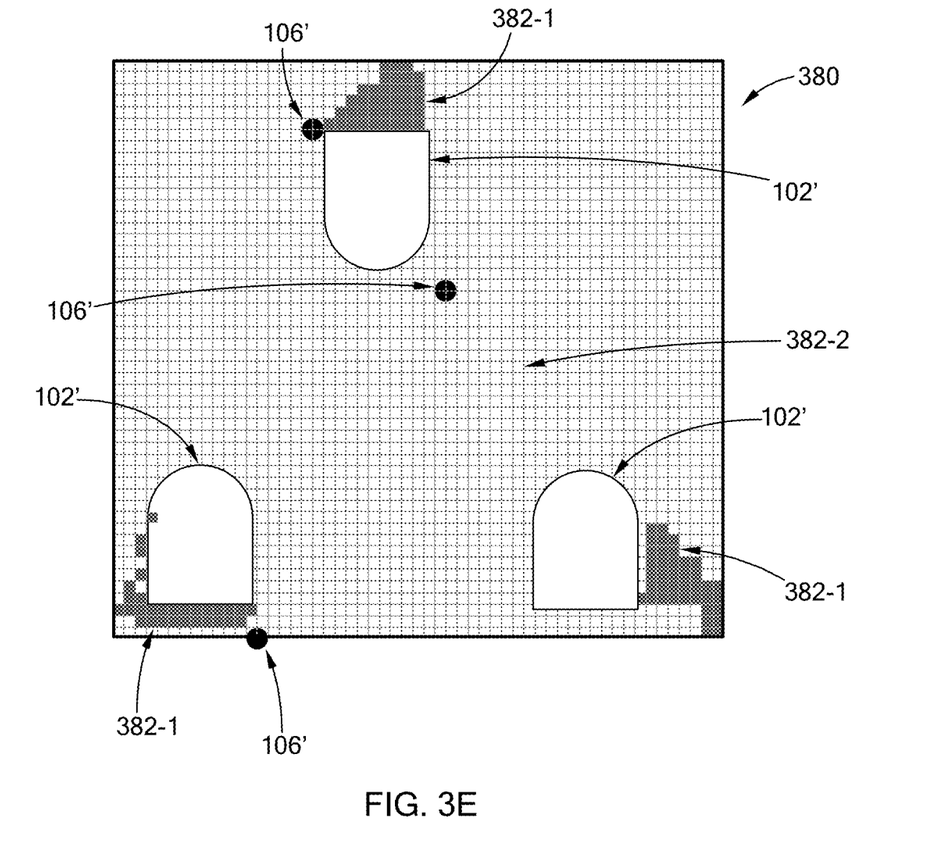
FIG. 3E illustrates a comparison between an undetectable area and one or more detection metrics in accordance with the teachings of the present disclosure.

At 316, the sensor placement computing system 200 determines whether the undetectable zone satisfies one or more detection metrics. Example detection metrics include, but are not limited to: whether a size of the undetectable zone satisfies a size criteria (e.g., an area or cross-sectional area of the undetectable zone is less than a threshold area, a volume of the undetectable zone is less than a threshold volume, a relative area and/or volume of the undetectable zone is less than a threshold area and/or volume, among others); a location criteria (e.g., whether the undetectable zone is located near a location in which a human may be positioned during operation of the corresponding robot 102, whether the undetectable zone is located near a location in which at least a portion of the automated tasks of the corresponding robot 102 occur, among others), and/or number of sensors (e.g., adding one or more sensors to areas that are undetectable and should be monitored, reducing number of sensors when one or more workplace sensors have overlapping field of view). In some forms and as illustrated in FIG. 3E, the size of the undetectable zone may be determined by including a grid 380 within the digital model 100', wherein each cell 382 of the grid 380 corresponds to a particular zone of the digital model 100' and indicates whether the particular zone is within a field of view of the workspace sensor(s) 106'. As an example, undetectable cells 382-1 may correspond to the undetectable zone and may have a first characteristic (e.g., a first shading, coloring, and/or the like), and detectable cells 382-2 may correspond to the detectable zone and may have a second characteristic. Accordingly, a relative size of the undetectable zone may be determined by dividing a number of undetectable cells 382-2 by the number of detectable cells 351-1, and the relative size of the undetectable zone may be compared to the threshold value to determine whether the one or more detection metrics are satisfied. If the undetectable zone satisfies the one or more detection metrics, the routine 300 proceeds to 324; otherwise, the routine 300 proceeds to 320.

At 320, the sensor placement computing system 200 modifies the sensor configuration of the workspace sensor(s) 106' of the digital model 100'. As an example, modifying the sensor configuration includes changing a number of the workspace sensor(s) 106' of the digital model 100', a placement of the workspace sensor(s) 106' of the digital model 100', a pose of the workspace sensor(s) 106' of the digital model 100', or a combination thereof. In some forms, the sensor configuration may be modified in order to, for example, decrease the size of the undetectable zone, minimize a number of workspace sensors 106, ensure that high-priority areas are within a detectable zone, among others. The routine 300 then proceeds to 312.

At 324, the sensor placement computing system 200 determines whether additional poses and/or locations of the robot 102' are present for the dynamic simulation. If so, the routine 300 proceeds to 328; otherwise, the routine 300 proceeds to 332. At 328, the sensor placement computing system 200 selects the next pose and/or position of the robot 102' and then proceeds to 312. At 332, the sensor placement computing system 200 stores the sensor configuration. In some forms, the stored sensor configuration represents the optimal sensor configuration of the workspace 100. The routine 300 then ends.

Figure 4:
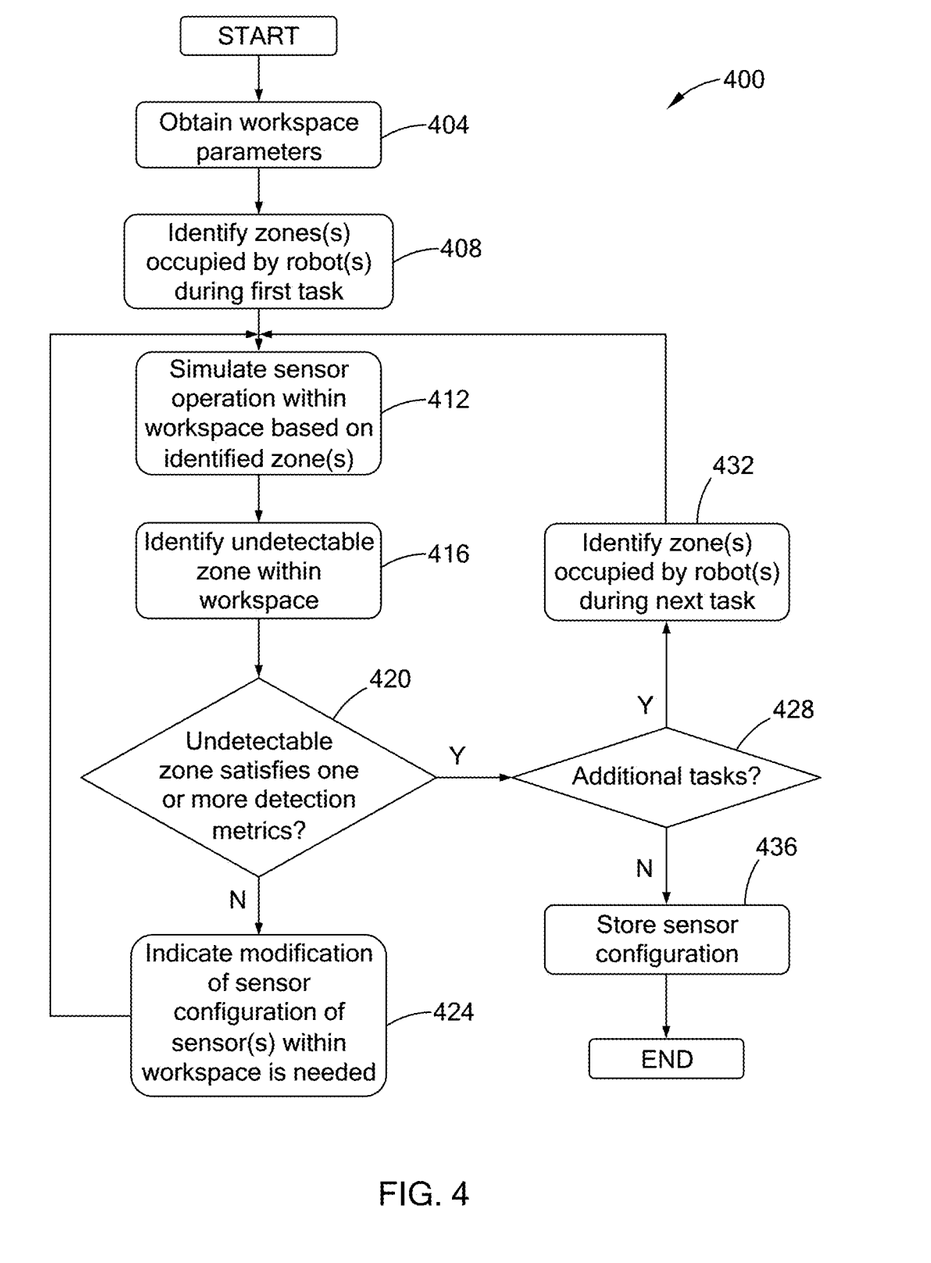
FIG. 4 illustrates yet another example control routine in accordance with the teachings of the present disclosure.

Referring to FIG. 4, an example simulation routine 400 is provided, and the simulation routine 400 is performed by the sensor placement computing system 200. In some forms, the simulation routine 400 can be executed when the robot 102 is a stationary robot and when the undetectable zones of the workspace 100 need to be detected while the robot 102 performs one or more tasks. In one variation, the simulation routine 400 can be executed when the robot 102 is a mobile robot configured to move to various locations within the workspace 100 and when the undetectable zones of the workspace 100 need to be detected while the robot 102 moves to particular locations within the workspace 100 and while the robot 102 performs one or more tasks.

At 404, the sensor placement computing system 200 obtains the parameters of the workspace 100. At 408, the sensor placement computing system 200 identifies the zone occupied by the robot 102 during a first task. At 412, the sensor placement computing system 200 simulates the sensor operation of the workspace sensor(s) 106. At 416, the sensor placement computing system 200 identifies the undetectable zones within the workspace 100. At 420, the sensor placement computing system 200 determines whether the undetectable zone satisfies one or more detection metrics. If so, the routine 400 proceeds to 424; otherwise, the routine 400 proceeds to 428. At 424, the sensor placement computing system 200 generates an indication (e.g., using the user interface 204) that the sensor configuration of the workspace sensor(s) 106 of the workspace 100 needs to be modified and then proceeds to 412. At 428, the sensor placement computing system 200 determines whether the robot 102 needs to complete additional tasks. If so, the routine 400 proceeds to 432; otherwise, the routine 400 proceeds to 436. At 432, the sensor placement computing system 200 identifies the zone occupied by the robot 102 during the next task and then proceeds to 412. At 436, the sensor placement computing system 200 stores the sensor configuration. The routine 400 then ends.

Figure 5:
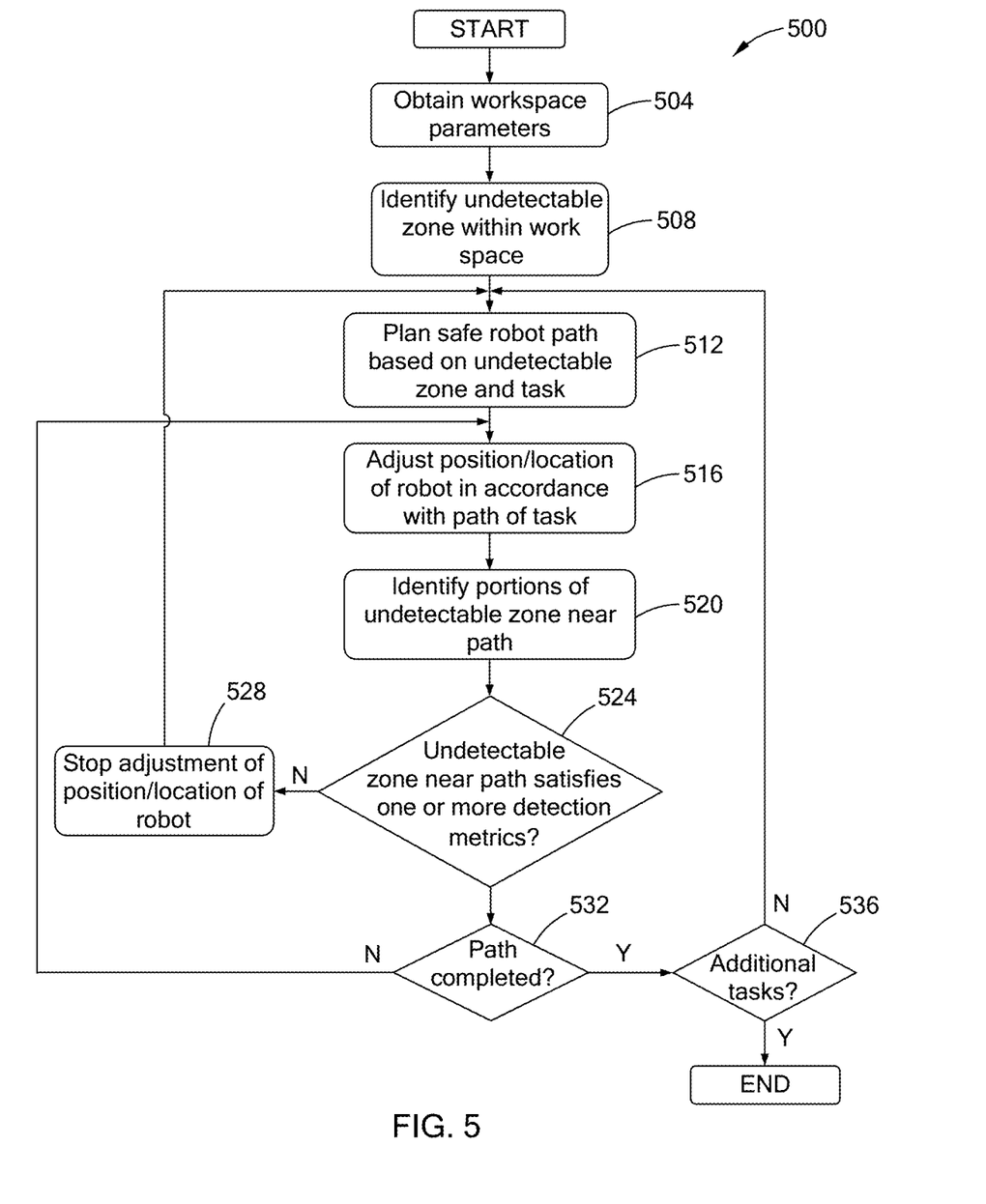
FIG. 5 illustrates yet another example control routine in accordance with the teachings of the present disclosure.

Referring to FIG. 5, an example path planning routine 500 is provided, and the path planning routine 500 is performed by at least one of the sensor placement computing system 200 and the robot controller 112. At 504, the sensor placement computing system 200 obtains the parameters of the workspace 100. At 508, the sensor placement computing system 200 identifies the undetectable zone of the workspace 100 based on, for example, at least one of the workspace parameters and/or a simulation that corresponds to the workspace 100 and that indicates the undetectable zones. At 512, the sensor placement computing system 200 plans a safe path of the robot 102 based on the identified undetectable zone and the task to be performed.

At 516, the robot controller 112 adjusts the position and/or location of the robot 102 in accordance with the path associated with the task. At 520, the sensor placement computing system 200 identifies portions of the undetectable zone near the path of the robot 102. At 524, the sensor placement computing system 200 determines whether the undetectable zone along the path satisfies one or more detection metrics. As an example, the one or more detection metrics may be satisfied if the undetectable zone and the path are separated by at least a threshold distance. As another example, the one or more detection metrics may be satisfied if the path has predefined characteristics (e.g., the path is only a rotation of one of the links of the robot 102). If the one or more detection metrics are satisfied, the routine 500 proceeds to 532; otherwise, the routine 500 proceeds to 528.

At 528, the robot controller 112 stops the adjustment of the position and/or location of the robot 102 in accordance with the task and then proceeds to 512. At 532, the sensor placement computing system 200 and/or the robot controller 112 determines whether the path associated with the task is completed. If so, the routine 500 proceeds to 536; otherwise, the routine 500 proceeds to 516. At 536, the sensor placement computing system 200 and/or the robot controller 112 determines whether additional tasks are to be performed by the robot 102. If so, the routine 500 proceeds to 512; otherwise, the routine 500 ends.

It should be readily understood that the routines 300, 400, and 500 are just example implementations of the sensor placement computing system 200 and other control routines may be implemented.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, the term "module" and/or "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

What is claimed is:

1. A method comprising:
   generating a workspace model having a robot based on at least one of an environment parameter and a regulated space, wherein the workspace model is a digital model of a workspace;
   simulating a sensor operation of a sensor within the workspace model based on sensor characteristics of the sensor, wherein the sensor characteristics includes a field of view of the sensor, a pose of the sensor, a location of the sensor, or a combination thereof;
   identifying an undetectable area within the workspace model having the robot based on the simulated sensor operation;
   determining whether the undetectable area satisfies one or more detection metrics, wherein the one or more detection metrics indicate a size criteria of the undetectable area, a location criteria of the undetectable area, or a combination thereof; and
   performing a sensor placement control in response to the undetectable area not satisfying the one or more detection metrics to obtain a sensor placement scheme of the workspace, wherein the sensor placement scheme identifies an undetectable area within the workspace when applicable, wherein performing the sensor placement control comprises modifying a sensor configuration within the workspace model based on a sensor placement algorithm, and wherein the sensor configuration includes changing a number of sensors in the workspace model, placement of the sensor, pose of the sensor, or a combination thereof.

2. The method of claim 1, wherein the sensor placement algorithm is configured to iteratively modify the sensor configuration based on one or more predefined sensor layouts until the undetectable area within the workspace model satisfies the one or more detection metrics.

3. The method of claim 1 further comprising simulating a robot operation within the workspace model, wherein the robot simulation is based on a first robot pose of the robot and positional characteristics of the robot, wherein the undetectable area within the workspace model is further identified based on the robot operation.

4. The method of claim 3, wherein the positional characteristics of the robot provide a static operation of the robot, a dynamic operation of the robot, or a combination thereof.

5. The method of claim 4, wherein with the positional characteristics being the dynamic operation of the robot, the robot operation includes a plurality of robot poses performable by the robot.

6. The method of claim 1, wherein the environment parameter includes an operating range of the robot.

7. The method of claim 1, wherein the regulated space includes at least one of a restricted zone and a hazard zone.

8. A system comprising:
   one or more processors configured to execute instructions stored in a nontransitory computer-readable memory, wherein the instructions comprise:
   generating a workspace model having a robot based on at least one of an environment parameter and a regulated space, wherein the workspace model is a digital model of a workspace;
   simulating a sensor operation of a sensor within the workspace model based on sensor characteristics of the sensor, wherein the sensor characteristics includes a field of view of the sensor, a pose of the sensor, a location of the sensor, or a combination thereof;
   identifying an undetectable area within the workspace model having the robot based on the simulated sensor operation;
   determining whether the undetectable area satisfies one or more detection metrics, wherein the one or more detection metrics indicate a size criteria of the undetectable area, a location criteria of the undetectable area, or a combination thereof; and
   performing a sensor placement control in response to the undetectable area not satisfying the one or more detection metrics to obtain a sensor placement scheme of the workspace, wherein the sensor placement scheme identifies an undetectable area within the workspace when applicable, wherein the instructions for performing the sensor placement control comprise modifying a sensor configuration within the workspace model based on a sensor placement algorithm, and wherein the sensor configuration includes changing a number of sensors in the workspace model, placement of the sensor, pose of the sensor, or a combination thereof.

9. The system of claim 8, wherein the sensor placement algorithm is configured to iteratively modify the sensor configuration based on one or more predefined sensor layouts until the undetectable area within the workspace model satisfies the one or more detection metrics.

10. The system of claim 8, wherein the instructions further comprise simulating a robot operation within the workspace model, wherein the robot simulation is based on a first robot pose of the robot and positional characteristics of the robot, wherein the undetectable area within the workspace model is further identified based on the robot operation.

11. The system of claim 10, wherein the positional characteristics of the robot provide a static operation of the robot, a dynamic operation of the robot, or a combination thereof.

12. The system of claim 11, wherein with the positional characteristics being the dynamic operation of the robot, the robot operation includes a plurality of robot poses performable by the robot.

13. The system of claim 8, wherein the environment parameter includes an operating range of the robot.

14. The system of claim 8, wherein the regulated space includes at least one of a restricted zone and a hazard zone.

* * * * *